United States Patent [19]

Gierut et al.

[11] Patent Number: 4,596,429
[45] Date of Patent: Jun. 24, 1986

[54] ELECTRICAL COMMONING ARRANGEMENT FOR PIN ARRAYS

[75] Inventors: Frederick J. Gierut, Tinley Park; Robert J. Gugelmeyer, Aurora; Connie S. Rindal, Lisle; Stephen A. Colleran, Plainfield, all of Ill.

[73] Assignee: Molex Incorporated, Lisle, Ill.

[21] Appl. No.: 725,075

[22] Filed: Apr. 19, 1985

[51] Int. Cl.$^4$ .............................................. H01R 31/08
[52] U.S. Cl. ...................................................... 339/19
[58] Field of Search ..................... 339/19, 18 R, 18 C, 339/18 P, 222

[56] References Cited

U.S. PATENT DOCUMENTS 3,747,050  7/1973  Hecht .............................. 339/276 A
4,352,534  10/1982  Johnson ................................. 339/19

FOREIGN PATENT DOCUMENTS 1514988  6/1978  United Kingdom .................. 339/19

OTHER PUBLICATIONS

Oriental Terminal Products Co. Ltd, Jumper Clip advertising brochure, 1-1980.

Primary Examiner—Neil Abrams
Attorney, Agent, or Firm—Louis A. Hecht

[57] ABSTRACT

In an electrical commoning arrangement including a printed circuit board with at least two parallel rows of conductive pins mounted therein, a removeable shunt connector for electrically commoning two pins is disclosed. The shunt connector includes a terminal defining at least three colinear pin receiving portions whereby the shunt connector can be selectively mated with two adjacent pins of the same row, or with two corresponding pins of different rows.

4 Claims, 10 Drawing Figures

ELECTRICAL COMMONING ARRANGEMENT FOR PIN ARRAYS

BACKGROUND OF THE INVENTION

1. Field of the Invention

The present generally relates to commoning electrical connectors which mate with an array of pins.

2. Brief Description of the Prior Art

Many electronic devices today are being designed with an increased number of components which are adapted to be mounted on a printed circuit board. As a result, space on a printed circuit board is one of the prime design considerations when attempting to lay out the location of various components thereon.

One type of component frequently found on printed circuit boards are square wire pins. Some pins have a nominal dimension of 0.045 inches and are adapted to be force fit through punched holes in the printed circuit board. After the pins are inserted into the printed circuit board, they are wave soldered to provide an electrical connection between the pins and the circuitry formed on the board.

Along with miniaturization, came the advent of 0.025 inch square wire pins. The advantage of the smaller pin is that a smaller mating female connector could be used. Thus, less printed circuit board area would be required. Frequently, pin arrays are typically mated with a female or pin-receiving connector, employing mass termination techniques. Generally speaking, female connectors of this type include a housing made of insulation material having parallel top and bottom rows of elongated terminal receiving cavities, each cavity having a pin receiving opening in a forward end and a wire receiving opening at the rearward end. The pin receiving opening has the safe configuration as the multi-row pin array. A plurality of terminals are provided for mounting in the cavities, each terminal having a pin engaging portion at the forward end and a wire engaging portion at the rearward end.

However, electrical connection outside of an electronic component having a pin array is not always required. Sometimes the pin array is provided as a convenient means of programming or otherwise selectively adapting an electronic circuit by completing the connection between two or more pins. At other times, pin terminals must be electrically connected together to handle a larger current flow, or to distribute a signal among several different circuit portions, for example. In the past, terminals have been shunted through jumper wires having pin receiving connectors mounted at each end thereof. This arrangement is flexible, particularly if the distance between rows of pins is not equal to the centerline spacing of pins in a given row.

However, a simple one-piece shunt connector would make pin identification easier, and would expedite assembly of the electronic component.

SUMMARY OF INVENTION

It is, therefore, a principle object of the present invention to provide an electrical commoning, or shunt connector for connecting together pairs of pins in a pin array.

Another object of the present invention is to provide a commoning connector for pin terminals which have a square cross-section, the commoning connector being mateable with either the flat surfaces of the terminals or the edge corners of the terminals.

Yet another object of the present invention is to provide a commoning connector which can accommodate pairs of pins having two different centerline spacings.

These and other objects of the present invention are provided in an electrical commoning arrangement including a printed circuit board with at least two parallel rows of conductive pins mounted thereon, adjacent pins of each row being uniformly spaced-apart a first predetermined distance and each pin from one row being spaced-apart a second predetermined distance from the closest corresponding pin from the other row. A selectively removeable shunt connector for electrically commoning two pins comprises at least three colinear pin receiving portions defining two outer pin receiving portions and at least one inner pin receiving portion. The distance between the outer pin receiving portions is equal to one of the predetermined distances and the distance between one of the outer pin receiving portions and an inner pin receiving portion is equal to the other predetermined distance. The shunt connector can thereby be selectively mated with two adjacent pins of the same row or corresponding pins of different rows.

BRIEF DESCRIPTION OF THE DRAWINGS

In the drawings, wherein like elements are referenced alike,

FIGS. 3a-3d show one commoning arrangement of the present invention, wherein FIGS. 3a and 3b are front and side elevation views, respectively, FIG. 3c is a bottom view, and FIG. 3d is a cross-section view taken along the lines 3d—3d of FIG. 1; and FIG. 4 shows another commoning connector of the present invention wherein

DETAILED DESCRIPTION OF THE PREFERRED EMBODIMENT

Figure 1:
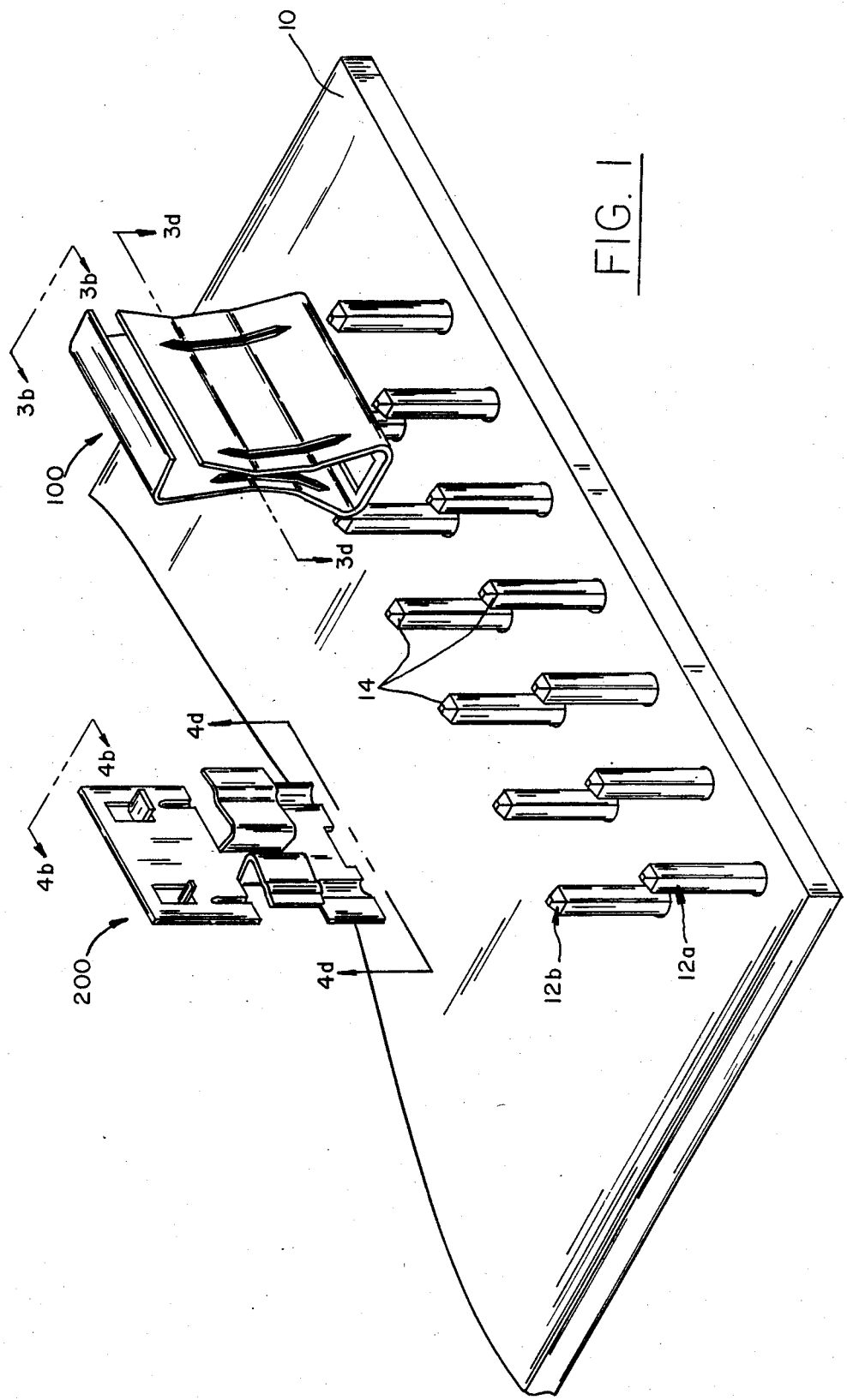
FIG. 1 is a perspective view of two different commoning arrangements according to the present invention, which are adapted for mounting on a printed circuit board.

Referring now to the drawings, and especially to FIG. 1, two different electrical commoning arrangements designated 100, 200, are shown including a printed circuit board 10 having two parallel rows 12a,12b of conductive pins 14 mounted thereon. Adjacent pins within each row 12a,12b are uniformly spaced apart a first predetermined distance. Each pin of row 12a is spaced apart a second predetermined distance from the closest corresponding pin of the other row 12b. As shown in FIG. 1, rows 12a,12b comprise parallel colinear rows of terminals. Rows 12a,12b may be aligned or, as indicated in the preferred embodiment, are staggered with respect to each other.

Figure 2:
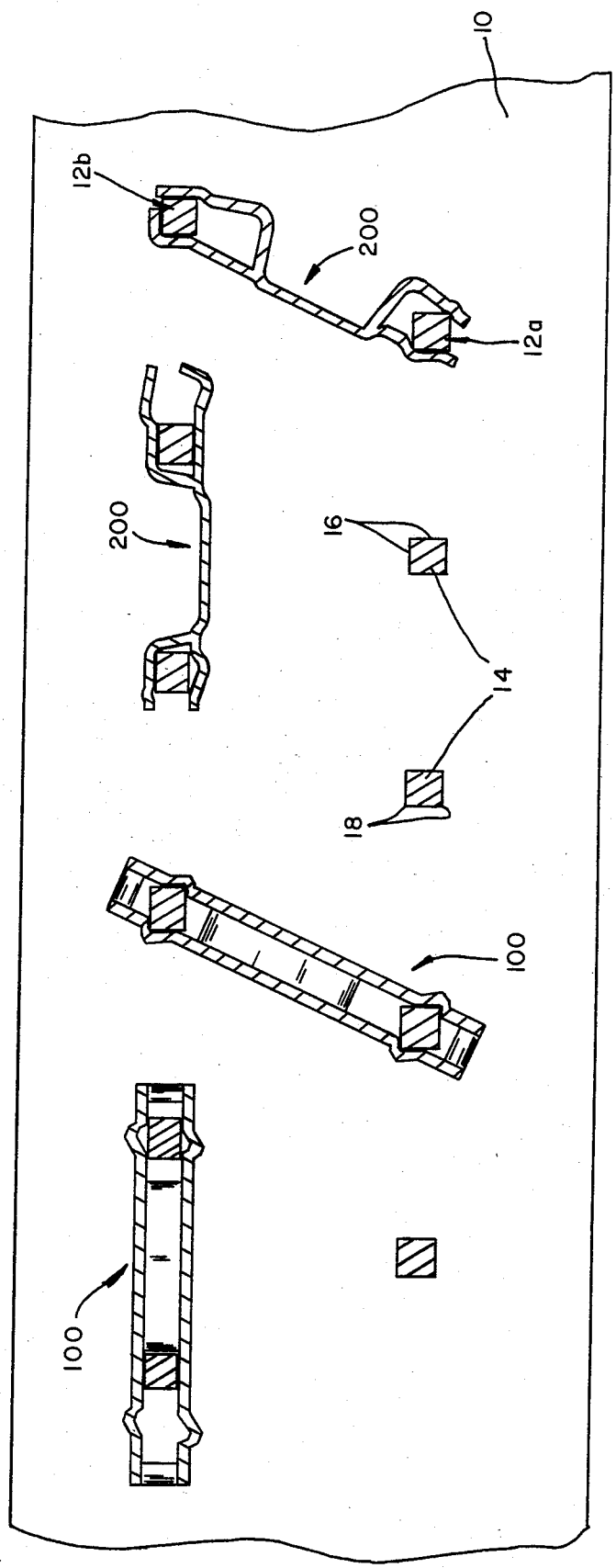
FIG. 2 is a plan view of the two commoning connectors of FIG. 1 shown installed in a printed circuit board mounted pin array.

FIG. 2 is a plan view of the printed circuit board and pin terminal array similar to that of FIG. 1 wherein several commoning connectors 100,200 are shown connecting pins of the same row, or connecting a pair of pins taken one from each row. As can be seen in FIG. 2, the two rows 12a,12b of pins 14 each have identical centerline spacings, while the distance between adjacent pins, one pin taken from each row, is a second larger distance. According to the present invention, the commoning connectors 100,200 are capable of commoning pins on two different centerline spacings.

Apart from being able to accept pins of two different centerline spacings, it can be seen from FIG. 2 that the commoning connectors 100,200 are capable of mating with the flat sides 16 of terminals 14, as well as the corners 18 thereof. In the preferred embodiment of FIG. 2, the flat sides 16 of the square cross-section terminals are mated when pins of a single row are connected together, and the corners 18 of the terminals are mated when a pair of pins, taken one from each row, are connected together.

Referring now to FIGS. 3a–3d, a first commoning connector 100 according to the present invention is shown comprising a unitary terminal member 110 which is stamped from an integral metallic blank. Terminal 110, as seen most readily in FIGS. 3b and 3d, comprises two spaced-apart wall members 114,116 joined at their lower ends to a common bight or end wall portion 120. Two pin receiving windows 124,126 are formed in end wall 120. Outwardly extending trough-like channels or dents 128a,128b are formed in wall members 114,116.

Figure 3A:
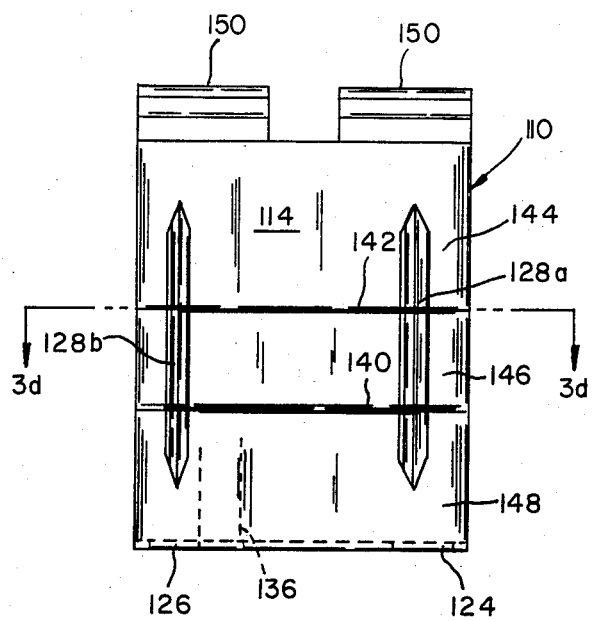
Figure 3B:
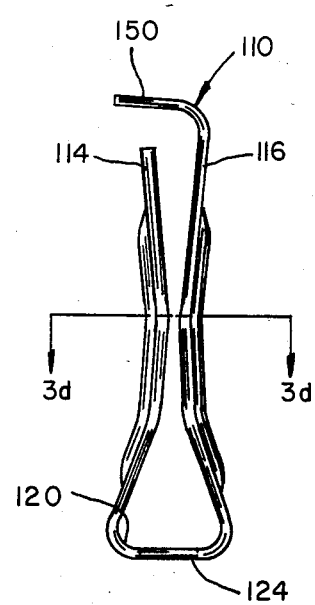

As shown in FIG. 2, dents 128 engage opposing corners 18 of terminals 14 when commoning pin terminals between rows 12a,12b. When commoning pin terminals of a single row, the pin terminals, although spaced-apart a different amount, are still received in windows 124,126 formed in the end wall 120 of terminal 110. As can be seen in FIG. 3a, the second window 126 is elongated so as to provide clearance for the shorter centerline spacing between terminals of a single row. Numerals 130,132 are applied to outer pin receiving portions of terminal 110 which are formed between wall members 114,116. The outer pin receiving portions communicate with the protrusions or dents 128 to accommodate the increased apparent terminal width taken across the diagonals of the square cross-section pins. A numeral 136 is applied to a third intermediate pin receiving portion which accommodates the closer centerline spacing of terminals mounted in a single row. The intermediate pin receiving portion, as can be seen most clearly in FIGS. 3a,3d, does not communicate with a dent portion but rather provides terminal access to the relatively flat, parallel spaced-apart wall sections 114,116. As indicated in FIGS. 3a,3b wall sections 114,116 are mirror images of each other, each being formed by two fold lines 140,142 to form three wall sections, an upper divergent wall section 144 an intermediate convergent wall section 146 and a lower less convergent wall section 148. To provide increased contact pressure, the portion of terminal walls 114,116 lying adjacent the upper fold line 142, is disposed to make line contact with terminals 14.

According to the present invention, terminal 110 is formed such that walls 114,116 separate a constant predetermined distance upon receiving both types of pairs of pin terminals. This constant separation is provided when the sides of a pin terminal are engaged or when the diagonal corners of a pin terminal are engaged. Thus, a constant spring force is applied to the contact mating portions of the pin receiving portions 130,132 and 136. As will be appreciated by those skilled in the art, terminal 110 is capable of reliable electrical connection over a range of tolerances of pin cross-section geometries, and rotational displacements that pins may take about their axis.

To limit the depth of insertion of pin terminals 14 within terminal 110, upper ear-like stop portions 150 are formed by bending over the upper end of terminal 116.

Figure 3C:
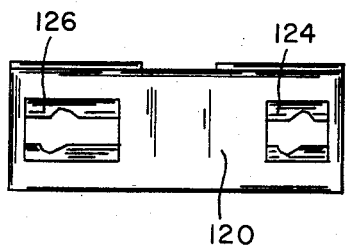
Figure 3D:
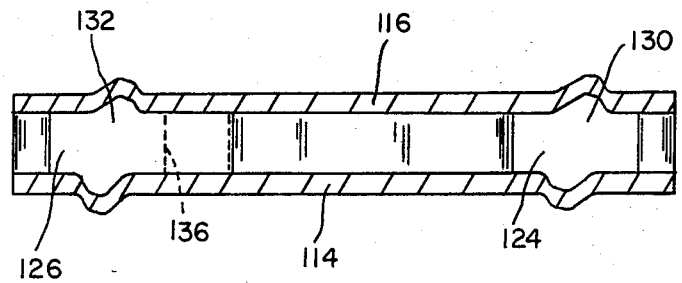

FIG. 3c is a bottom view of terminal 110, showing windows 124,126 formed in bight 120. Alternatively, the bottom wall 120 need not include accurately defined window portions through which pins 14 are received, if the terminal is mounted in a dielectric housing having formed therein a counterpart opening similar to that of windows 124,126.

Referring now to FIGS. 4a–4d a second commoning connector of the present invention is shown designated generally by the numeral 200. As with terminal 100, terminal 200 is formed from an integral stamped metallic blank. Terminal 200 includes three wall members forming four wall portions. A first wall member 214 having a first end portion 214a and a second end portion 214b. A second wall member 216 opposes end section 214a, and a third wall member 218 opposes wall section 214b. A first outer pin receiving portion 230 is formed between wall portion 214a and wall member 216. A second outer pin receiving portion 232 is formed between the outer ends of opposing wall members 214b,218. An intermediate pin receiving portion 236 is formed between the inner portions of opposing wall members 214b,218, as can be seen most clearly in FIG. 4d. Terminal 200 is formed from an integral stamped blank lying in the plane of wall member 214. The blank is then sheared along lines 240,242 to form an upper wall portion 244, an intermediate wall portion 246, and a lower wall portion 248. After shearing, intermediate portion 246 is outwardly bent to form wall members 216,218. A locating gussett 250 (see FIGS. 4a,4b) provides a locating means when terminal 200 is inserted in a dielectric housing. A locking lance 252 is struck out from bottom wall portion 248 to engage a dielectric housing when terminal 200 is therein inserted. The blocking portions 254,255 are formed in upper wall portion 244 to prevent terminal 200 from being inserted in an unintended upside-down manner.

Referring again to FIG. 4d, the pin receiving portions 230,232 and 236 will be described in greater detail. When connecting pin terminals of a single row, outer wall section 214a engages a flat side 16 of a terminal 14. A pocket 216a formed in wall 216 engages an outside corner of an opposing terminal edge. The other terminal is received in portion 236, with the inner portion 260 of wall 214b engaging the flat side 16 of the terminal. The opposing side of the terminal engages the flat wall portion 218a of wall 218. It should be understood that walls 216,218 are outwardly deflected from wall portions 214a,214b respectively when a pin is inserted therebetween. The resilience of wall sections 216,218 is controlled by the geometry of interconnecting intermediate wall portions 217,219 which support walls 216,218 respectively.

When connecting terminals of different rows, the pin receiving portions 230,232 expand to accept the diagonal terminal width. Referring to pin receiving portion 230, one corner of a terminal 14 is received in terminal pocket 215a formed in wall portion 214a. The flat surface 16 immediately adjacent the terminal corner is engaged by contact surface 260. The opposing corner of the terminal is received in pocket 216a formed in wall 216. Owing to the pocket formations in this pin receiving portion, expansion of the free ends of walls 216,214a is essentially identical to that resulting when terminals of a single row are connected together. The other terminal is received in pin receiving portion 232 wherein one side of the terminal is engaged by mating surface 262 formed in wall 214d, and an opposing side face 16 is engaged by contact surface 264 of wall 218. The free end 266 of wall 214b is conveniently bent over to trap a first corner of the terminal 14. The opposing corner of terminal 14 is received in the outward protrusion 268 formed roughly at the midpoint of wall 218. As can be seen from the above, whether connecting pins of a same row or pins of two adjacent rows, terminal 200 of the present invention provides a secure reliable mating engagement insuring a reliable electrical connection between the pins.

Figure 4A:
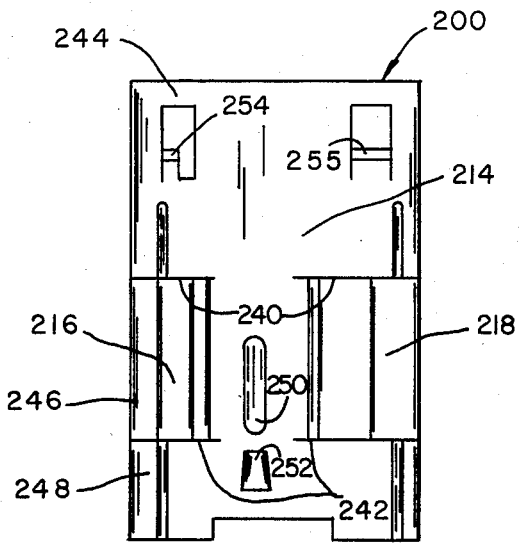
FIGS. 4a and 4b are front and side elevational views.
Figure 4B:
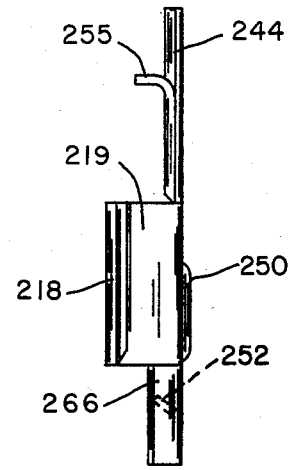
Figure 4D:
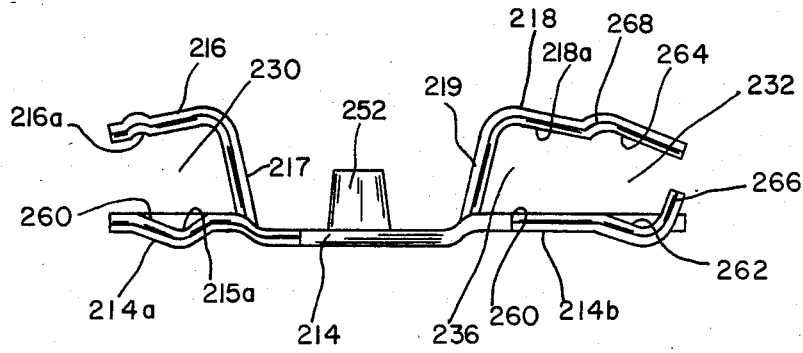
FIG. 4d is a bottom view indicated by lines 4d—4d of FIG. 1.
Figure 4C:
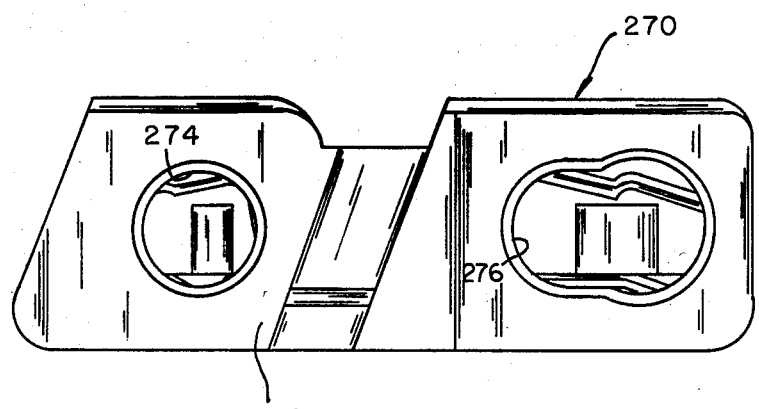
FIG. 4c is a bottom view showing the terminal installed in a dielectric housing.

Referring now to FIG. 4c, terminal 200 is shown installed in a dielectric housing 270, wherein FIG. 4c is a bottom view of a completed connector assembly, showing the end wall 272 of housing 270 having two pin-receiving windows 274,276 formed therein. Housing window 274 communicates with pin receiving portion 230, while housing window 276 communicates with both pin receiving portions 232,236. Housing end wall 272 provides initial guiding of the terminal pins within terminal 200.

In either embodiment of the present invention, the connector terminals define three colinear pin receiving portions defining two outer pin receiving portions having a first centerline spacing, and an intermediate pin receiving portion which, in combination with an outer pin receiving portion, defines a second, lesser centerline spacing. Thus, the shunt connector of either embodiment can be selectively mated with two adjacent pins of the same row, or with corresponding pins of different rows. As noted above, the corresponding pins can be aligned to form a rectangular grid array with the pin rows. Alternatively, the two rows can be staggered with respect to each other wherein the spacing of one row need not be identical to the spacing of the other row.

We claim:

1. In an electrical commoning arrangement including a printed circuit board with at least two parallel rows of conductive pins mounted thereon, said pins having a square cross section with corners and flat sides, adjacent pins of each row being uniformly spaced-apart a first predetermined distance and each pin from one row being spaced-apart a second predetermined distance from the closest corresponding pin from the other row, a selectively removeable shunt connector for electrically commoning two pins comprising:

at least two resiliently spaced-apart wall members forming at least three colinear pin receiving portions therebetween, said portions defining two outer pin receiving portions and at least one inner pin receiving portion, the distance between said outer pin receiving portions being equal to one of said predetermined distances and the distance between one of said outer pin receiving portions and an inner pin receiving portion being equal to said other predetermined distance, and at least one of said pin-receiving portions having a pocket-like section for mateably receiving a corner and at least a portion of the adjacent flat sides of a pin to limit the contact force applied thereto, whereby said shunt connector can be selectively mated with two adjacent pins of the same row or corresponding pins of different rows.

2. The arrangement of claim 1 wherein the pins of one row are staggered with respect to pins of the other row.

3. The arrangement of claim 2 wherein the pins of one row are positioned equidistant between pairs of adjacent pins of the other row so that there are two corresponding pins in the other row.

4. The arrangement of claim 2 wherein said first distance is less than said second distance.

* * * * *